US 11,112,846 B2

(12) United States Patent
Strach et al.

(10) Patent No.: US 11,112,846 B2
(45) Date of Patent: Sep. 7, 2021

(54) PREDICTIVE ON-CHIP VOLTAGE SIMULATION TO DETECT NEAR-FUTURE UNDER VOLTAGE CONDITIONS

(71) Applicant: International Business Machines Corporation, Armonk, NY (US)

(72) Inventors: Thomas Strach, Wildberg (DE); Preetham M. Lobo, Bangalore (IN); Tobias Webel, Schwaebisch-Gmuend (DE)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 16/225,333

(22) Filed: Dec. 19, 2018

(65) Prior Publication Data

US 2020/0201407 A1 Jun. 25, 2020

(51) Int. Cl.
*G06F 1/28* (2006.01)
*G06F 1/30* (2006.01)
*G01R 19/165* (2006.01)
*G06F 30/3312* (2020.01)

(52) U.S. Cl.
CPC .......... *G06F 1/28* (2013.01); *G01R 19/16552* (2013.01); *G06F 1/30* (2013.01); *G06F 30/3312* (2020.01)

(58) Field of Classification Search
CPC ... G06F 1/26; G06F 1/32; G06F 1/324; G06F 1/329; G06F 1/3228; G06F 1/08; G06F 1/206; G06F 1/3203; G06F 1/3215; G06F 1/3231; G06F 1/3206; G06F 1/3296; G06F 1/3234; G06F 1/3237; G06F 1/3287;

(Continued)

(56) References Cited

U.S. PATENT DOCUMENTS

| 7,937,563 | B2 * | 5/2011 | Nafziger | G06F 9/3869 712/214 |
| 8,816,757 | B1 | 8/2014 | Yabbo et al. | |
| 8,943,334 | B2 | 1/2015 | Kumar et al. | |

(Continued)

FOREIGN PATENT DOCUMENTS

| EP | 2596413 B1 | 12/2016 | | |
| GB | 201616341 | * 11/2016 | ............... | G06F 1/28 |

OTHER PUBLICATIONS

Dasgupta et al., "Real-Time Monitoring of Short-Term Voltage Stability Using PMU Data", 2014 IEEE PES General Meeting | Conference & Exposition, Jul. 27-31, 2014, Summary Only, 1 page.

(Continued)

*Primary Examiner* — Zahid Choudhury
(74) *Attorney, Agent, or Firm* — James L. Olsen

(57) ABSTRACT

Embodiments of the present disclosure relate to detecting undervoltage conditions at a subcircuit. A power supply current of a first subcircuit is determined over a first number of previous clock cycles. A cross current flowing between the first subcircuit and a second subcircuit is determined over the first number of previous clock cycles. An estimated momentary supply voltage present at the first subcircuit is then determined based on the power supply current of the first subcircuit over the first number of previous clock cycles and the cross current flowing between the first subcircuit and the second subcircuit over the first number of previous clock cycles.

15 Claims, 4 Drawing Sheets

(58) Field of Classification Search
CPC ..... G06F 1/266; G06K 15/4055; Y04S 20/20; Y02D 10/00; H04L 12/10
See application file for complete search history.

(56) References Cited

U.S. PATENT DOCUMENTS

| | | |
|---|---|---|
| 9,292,295 B2 | 3/2016 | Shirvani et al. |
| 9,811,150 B2 | 11/2017 | Allen-Ware et al. |
| 2009/0150695 A1 | 6/2009 | Song et al. |
| 2014/0181537 A1* | 6/2014 | Manne ................. G06F 1/3243 713/300 |
| 2016/0098070 A1 | 4/2016 | Curran et al. |
| 2017/0153916 A1 | 6/2017 | Xu et al. |
| 2018/0088650 A1* | 3/2018 | Lobo ....................... G06F 1/266 |

OTHER PUBLICATIONS

Floyd et al., "Voltage Droop Reduction Using Throttling Controlled by Timing Margin Feedback", 2012 Symposium on VLSI Circuits (VLSIC), Jun. 13-15, 2012, 2 pages.

Strach et al., "Fine Resolution On-Chip Voltage Simulation to Prevent Under Voltage Conditions", U.S. Appl. No. 16/225,301, filed Dec. 19, 2018.

IBM, List of IBM Patents or Patent Applications Treated as Related, Dec. 19, 2018, 2 pages.

\* cited by examiner

PREDICTIVE ON-CHIP VOLTAGE SIMULATION TO DETECT NEAR-FUTURE UNDER VOLTAGE CONDITIONS

BACKGROUND

The present disclosure relates generally to semiconductor circuits, and in particular to detecting undervoltage conditions in semiconductor circuits.

In a processor there is circuit switching activity at each clock cycle which results in noise on the common supply rail—this is also referred to as power grid noise. A sudden local increase in switching activity can induce a local droop in the supply voltage to the common supply rail of the power distribution network. This local droop then propagates over the chip area and affects the supply voltage in other regions.

Semiconductor circuit voltage is a rapidly varying quantity within processors. For example, the voltage provided to a chip can change by 100 mV within a few nanoseconds when a processor changes its activity. With tight voltage margins on present semiconductor designs, it is increasingly important to detect undervoltage conditions as fast as possible. This is typically completed by using on-chip measurement circuitry such as Chip Power Model (CPM) or simulation engines such as distributed delayed instruction per cycle (dIPC). However, both of these approaches are "after the fact," and do not allow the prediction of undervoltage conditions one or more clock cycles in the future. There is a need for the ability to predict undervoltage conditions in the future, to allow for preemptive action (e.g., throttling) to be taken on a semiconductor circuit.

SUMMARY

Aspects of the present disclosure include a semiconductor circuit configured to detect undervoltage conditions. The semiconductor circuit can include a first subcircuit, a second subcircuit, and a power management circuitry. The power management circuitry can be configured to determine a power supply current of the first subcircuit over a first number of previous clock cycles, determine a cross current flowing between the first subcircuit and the second subcircuit over the first number of previous clock cycles, and determine an estimated momentary supply voltage present at the first subcircuit based on the power supply current of the first subcircuit over the first number of previous clock cycles and the cross current flowing between the first subcircuit and the second subcircuit over the first number of previous clock cycles.

Thus, by measuring power supply current and cross current over previous clock cycles, a supply voltage present at the first subcircuit can be estimated. The estimated supply voltage can be indicative of undervoltage conditions. This allows the determination of undervoltage conditions (e.g., or risk of undervoltage conditions) in the future, which can allow for preemptive action be taken at the subcircuit.

In various optional embodiments, the power management circuitry is further configured to generate a throttle signal for throttling the first subcircuit based on a comparison of the estimated momentary supply voltage with a prediction throttle threshold. Accordingly, throttling can be completed based on the comparison between the estimated supply voltage and a threshold which may be indicative of an undervoltage condition in the future.

Embodiments of the present disclosure also relate to a method for detecting undervoltage conditions at a first subcircuit. A power supply current of the first subcircuit can be determined over a first number of previous clock cycles. A cross current flowing between the first subcircuit and a second subcircuit can be determined over the first number of previous clock cycles. An estimated momentary supply voltage present at the first subcircuit can then be determined based on the power supply current of the first subcircuit over the first number of previous clock cycles and the cross current flowing between the first subcircuit and the second subcircuit over the first number of previous clock cycles.

Thus, by measuring power supply current and cross current over previous clock cycles, a supply voltage present at the first subcircuit can be estimated. The estimated supply voltage can be indicative of undervoltage conditions. This allows the determination of undervoltage conditions (e.g., or risk of undervoltage conditions) in the future, which can allow for preemptive action be taken at the subcircuit.

In various optional embodiments, the method further comprises throttling the first subcircuit based on a comparison of the estimated momentary supply voltage with a prediction throttle threshold. Accordingly, throttling can be completed based on the comparison between the estimated supply voltage and a threshold which may be indicative of an undervoltage condition in the future.

The above summary is not intended to describe each illustrated embodiment or every implementation of the present disclosure. The aforementioned advantages represent example advantages, and therefore, not all advantages of the various embodiments are described herein. Furthermore, some embodiments of the present disclosure can exhibit none, some, or all of the advantages listed herein while remaining within the spirit and scope of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
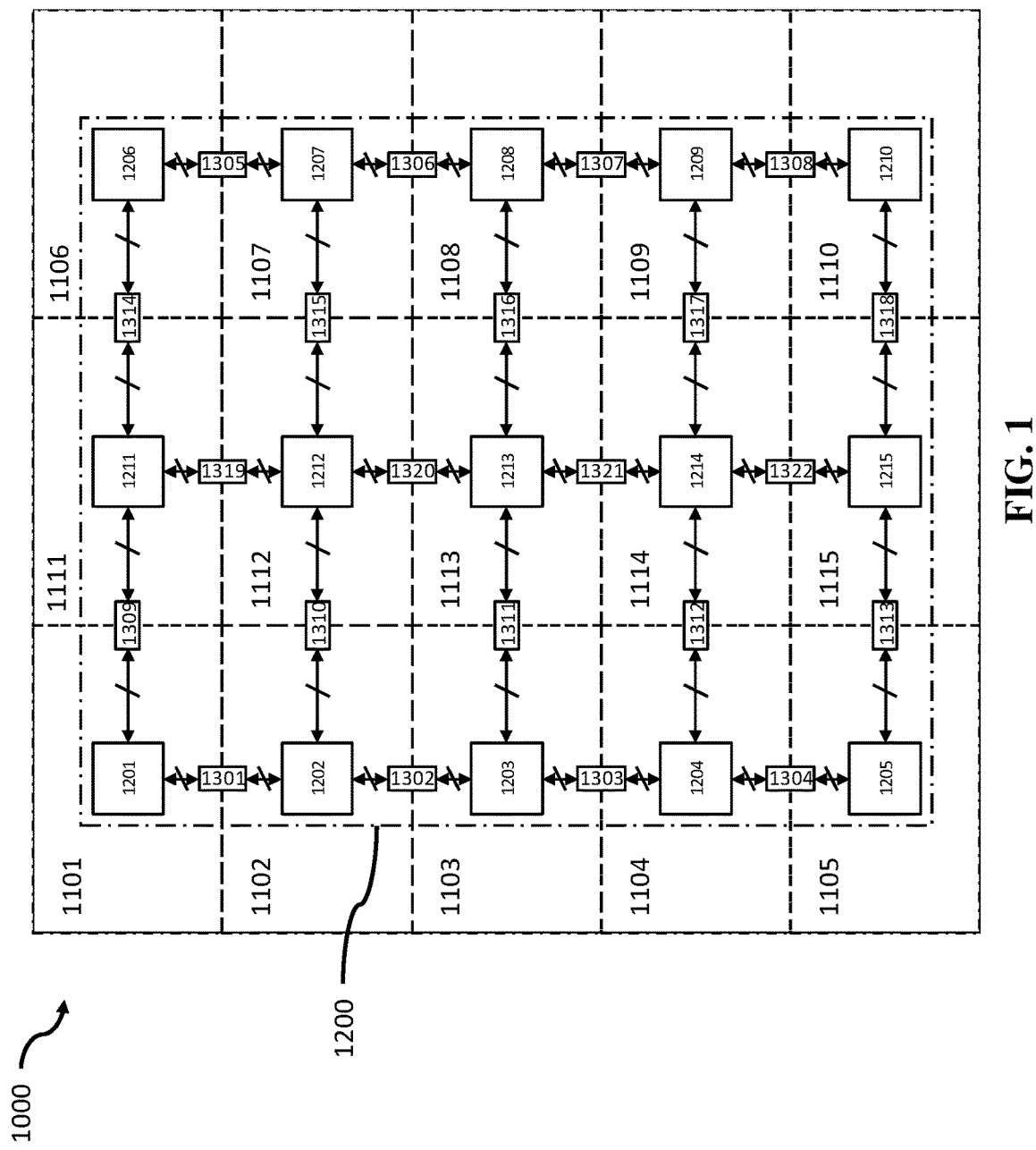
FIG. 1 is a diagram depicting a semiconductor circuit, in accordance with embodiments of the present disclosure

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate generally to semiconductor circuits, and in particular to detecting undervoltage conditions in semiconductor circuits. While the present disclosure is not necessarily limited to such applications, various aspects of the disclosure can be appreciated through a discussion of various examples using this context.

In a processor circuit switching activity occurs at each clock cycle which results in noise on the common supply rail (e.g., power grid noise). A sudden local increase in switching activity can induce a local droop in the supply voltage to the common supply rail of the power distribution network. This local droop then propagates over the chip area and affects the supply voltage in other regions. However, supply voltage may only fluctuate within a certain margin to ensure proper functioning of the semiconductor circuit.

Semiconductor circuit voltage is a rapidly varying quantity within processors. For example, the voltage provided to a chip can change by 100 mV within a few nanoseconds when a processor changes its activity. With tight voltage margins on present semiconductor designs, it is increasingly important to detect undervoltage conditions as fast as possible. This is typically completed by using on-chip measurement circuitry such as CPM (Chip Power Model) or simulation engines such as distributed dIPC (delayed instruction per cycle). However, both of these approaches are "after the fact," and do not allow the prediction of undervoltage conditions one or more clock cycles in the future.

Aspects of the present disclosure enable the detection of undervoltage conditions several clock cycles in the future. Predicting undervoltage conditions for future clock cycles can prevent upcoming chip undervoltage conditions by allowing proactive response. This is achieved by determining an estimated momentary supply voltage present at a particular subcircuit based on a power supply current of the subcircuit over a first previous number of clock cycles and a cross current flowing between the subcircuit and another subcircuit over the first previous number of clock cycles.

FIG. 1 is a circuit diagram illustrating a semiconductor circuit 1000 including a plurality of subcircuits 1101-1115. In embodiments, the semiconductor circuit 1000 is a computer processor chip. In embodiments, subcircuits 1101-1110 correspond to the processor cores of the computer processor chip. In embodiments, subcircuits 1111-1115 correspond to the cache of the computer processor chip, allowing for data transfer between the different processor cores (e.g., subcircuits 1101-1110).

The subcircuits 1101-1115 can be provided power by a common power supply, for example, a power grid placed above the subcircuits. During operation, the power consumption of the subcircuits 1101 to 1115 can fluctuate. For example, subcircuit 1105 can comprise a pipeline of a processing unit, where at least a portion of the pipeline includes an arithmetic unit, a load/store unit, a cache access unit, an instruction sequencing unit and an instruction decode unit. At a certain point of time, the pipeline can perform various switching operations. During these switching operations, the current supplied to subcircuit 1105 by the power supply can be high. At the same time, subcircuits 1104 and 1115 can be in an idle state and experience low power supply current. This can cause a cross current from subcircuits 1104 and 1115 to the subcircuit 1105. A high power supply current of subcircuit 1103, which is not entirely compensated by cross currents from the neighboring subcircuits 1102 and 1104, can cause a local voltage droop at the subcircuit 1105 of the supply voltage. Furthermore, the cross current from the subcircuits 1102 and 1104 can induce voltage droops at the subcircuits 1102 and 1104, even if the subcircuit 1102 and 1104 are in an idle state.

In embodiments of the present disclosure, the semiconductor circuit 1000 includes a power management circuitry 1200. The power management circuitry 1200 is configured to estimate a metric indicative of a momentary supply voltage present at the first subcircuit 1105 based on a power supply current of the subcircuit 1105 and a cross current flowing between the subcircuit 1105 and the subcircuits 1104 and 1115. The power management circuitry 1200 can derive the momentary supply voltage without actually measuring the power supply current of the subcircuit 1105, but based on activity indicators related to at least one part of the pipeline. Moreover, the power management circuitry 1200 can estimate the cross current based on current increments calculated from the momentary supply voltage.

As depicted in FIG. 1, the power management circuitry 1200 includes a grid (e.g., a network) of power management units 1201-1215. Each power management unit 1201-1215 corresponds to a respective subcircuit 1101-1115 (e.g., power management unit 1201 corresponds to subcircuit 1101, power management unit 1202 corresponds to subcircuit 1102, etc.). The power management units 1201-1215 can be configured to estimate the momentary supply voltage related to subcircuits 1101-1115. Further, the power management units 1201-1215 can be configured to throttle the subcircuit 1101 to 1115 based on the momentary supply voltage. For example, if the momentary supply voltage is indicative of a low local supply voltage at the subcircuit 1105, the operation frequency of the subcircuit 1105 can be lowered to ensure proper functioning of the semiconductor circuit.

The power management units 1201-1215 are connected to one another with connecting units 1301-1322. The connecting units 1301-1322 can enable data exchange between the power management units 1201-1215 relating to the cross current between the associated subcircuits. In some embodiments, the bit width of the data connection between the power management units 1201-1215 and the connecting units 1301-1322 is twenty bits. The twenty bits can include one parity bit, one sign bit, and eight value bits for each direction.

It is noted that FIG. 1 is intended to depict the representative major components of an exemplary semiconductor circuit 1000. In some embodiments, however, individual components can have greater or lesser complexity than as represented in FIG. 1, components other than or in addition to those shown in FIG. 1 can be present, and the number, type, and configuration of such components can vary.

Figure 2:
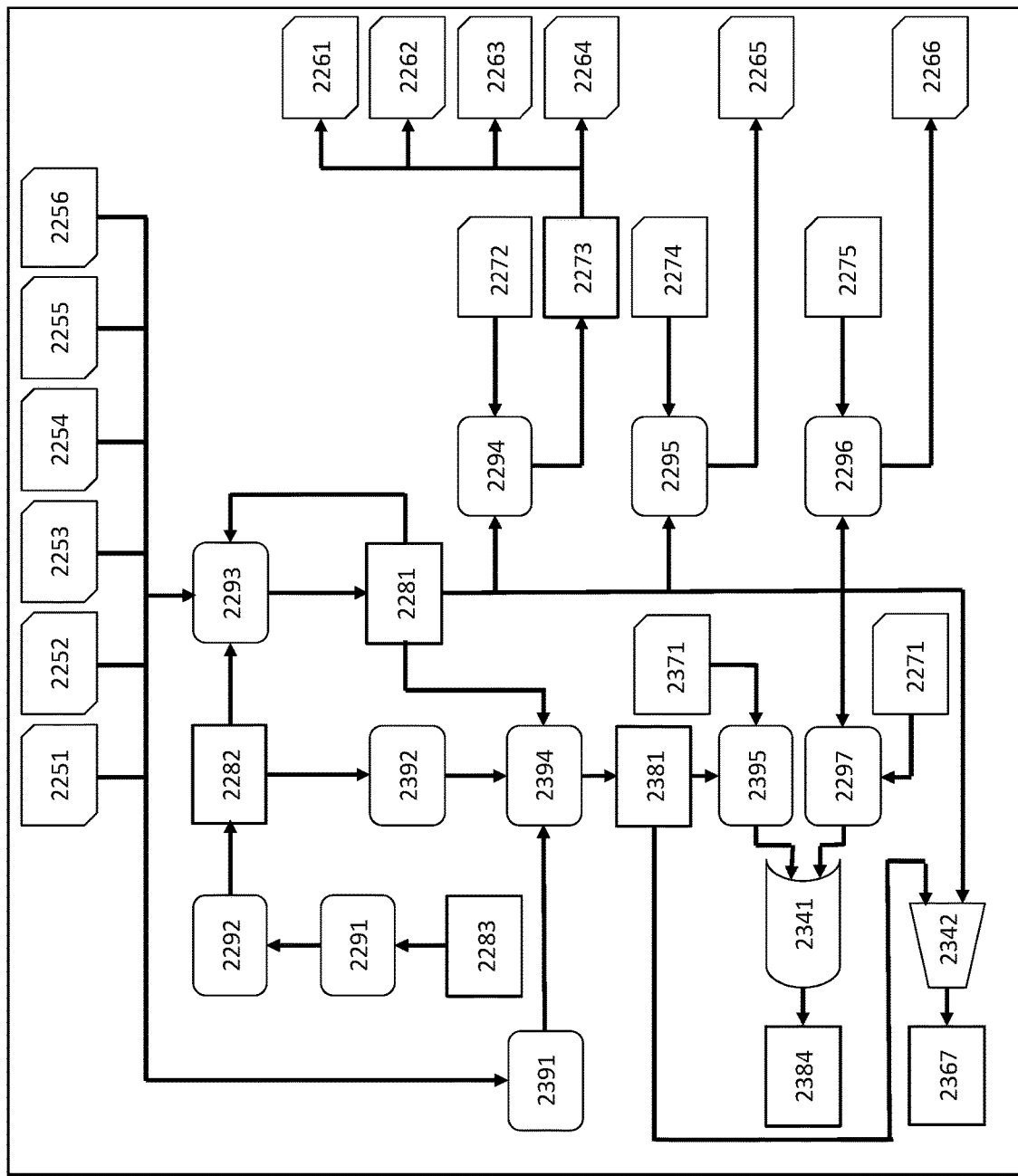
FIG. 2 is a diagram depicting a power management unit, in accordance with embodiments of the present disclosure.

Referring now to FIG. 2, shown is a diagram of a power management unit 2200 which can be implemented in a power management circuitry (e.g., power management circuitry 1200 of FIG. 1), in accordance with embodiments of the present disclosure. The power management unit 2200 includes four current signal inputs 2251, 2252, 2253 and 2254 configured to receive current signals indicative of a cross current from a subcircuit assigned to the power management unit 2200 to the immediately neighboring subcircuits. The power management unit 2200 further includes four increment current signal outputs 2261, 2262, 2263 and 2264 configured to transmit increment current signals indicative of a change of the cross current from the neighboring subcircuit to the subcircuit assigned to the power management unit 2200. The number of current signal inputs and increment current signal outputs can differ according to the number of neighboring subcircuits. For example, power management unit 1205 of FIG. 1 may only comprise two current signal inputs and two increment current signal outputs (based on two neighboring subcircuits 1104 and 1115).

Further, the power management unit 2200 includes a current signal input 2255 and a current signal input 2256 configured to receive a current signal indicative of a current from the subcircuit to ground and a signal indicative of a current to an external charge. Correspondingly, the power management unit 2200 also includes increment current outputs 2265 and 2266 for transmitting increment current signals indicative of a change of the current to ground and the current to the external charge, respectively.

In embodiments, the current signal inputs 2251-2256 can be configured to receive a 9 bit signal comprising one sign bit and 8 magnitude bits and the increment current signal outputs 2261-2266 can be configured to transmit a 9 bit signal comprising one sign bit, 6 magnitude bits and 2 fractional bits.

The power management unit 2200 further includes a momentary supply voltage register 2281 configured to store the momentary supply voltage present at an assigned subcircuit. The momentary supply voltage can also be considered as an indication of the charge accumulated by the assigned subcircuit (e.g., the addition of the previous self-current and cross current values in previous cycles). Moreover, the power management unit 2200 includes a self-current register 2282. The self-current register 2282 can be configured to store a value indicative of the power supply current of the assigned subcircuit. The value can, for example, be stored as an unsigned value with 7 magnitude bits.

In addition, the power management unit 2200 can include circuitry configured to determine the value indicative of the power supply current of the assigned subcircuit. In particular, this circuitry can include a core event register 2283, a weighting unit 2291, and a summing unit 2292. The weighting unit 2291 receives core events from the core event register 2283 and transmits weighted core events to the summing unit 2292. The summing unit 2292 transmits the sum of the weighted core events to the self-current register 2282.

As a simple example, one core event can be an arithmetic operation and another core event can be a cache access. Testing can show that the arithmetic operation involves a higher switching activity and a higher self-current than the cache access. Accordingly, a higher weight can be attributed to the core event "arithmetic operation" resulting in a higher number stored in the self-current register indicative of this higher self-current.

The power management unit 2200 further includes an adding unit 2293. The adding unit 2293 receives a self-current signal from the self-current register 2282, the current signal from the current signal inputs 2251-2256 and the momentary supply voltage from the momentary supply voltage register 2281. The received signals are added and transmitted to the momentary supply voltage register 2281. The momentary supply voltage register 2281 can be a register adapted for storing a number with one sign bit and 16 magnitude bits.

In the embodiment shown in FIG. 2, the power management unit 2200 comprises an increment current register 2273, an increment coefficient current register 2272, an increment coefficient current register 2274, and an increment coefficient current register 2275. The increment coefficient current registers 2272, 2274, and 2275 can be configured to store a coefficient indicative of the increment current induced by a certain value of the momentary supply voltage. The increment coefficient current registers 2272, 2274 and 2275 can be adapted to store a number including 12 fractional bits. The power management unit 2200 also includes multiplying units 2294, 2295 and 2296 receiving the momentary supply voltage from the momentary supply voltage register 2281 and increment coefficient currents from the increment current registers 2272, 2274 and 2275, respectively.

The multiplying units 2295 and 2296 can be configured to directly transmit the product thereof to the increment current signal outputs 2265 and 2266. The multiplying unit 2294 transmits the product to the increment current register 2273. The increment current register 2273 can be configured to store a number consisting of one sign bit, 6 magnitude bits and 2 fractional bits. The increment current signal outputs 2261-2264 can receive the increment current signal from the increment current register 2273.

The power management unit 2200 comprises a throttle threshold register 2271 and a comparing unit 2297. The comparing unit 2297 receives the momentary supply voltage from the momentary supply voltage register 2281 and a throttle threshold from the throttle threshold register 2271.

In addition, the power management unit 2200 includes a prediction unit 2392 configured to predict a self-current signal and a prediction unit 2391 configured to predict the current signal from current signal inputs 2251-2256, wherein the current signal can be indicative of a current to a neighboring subcircuit, indicative of a current from the subcircuit to ground, and/or indicative of a current to an external charge.

The prediction unit 2392 can predict a future self-current signal by analyzing the course (the previous self-current values over m of cycles) of the self-current signal. As a result of the prediction the prediction unit 2392 can output the maximum current signal during the last m number of cycles. For example, the prediction unit 2932 can output the maximum current signal during the last 8 number of cycles.

The prediction unit 2391 can predict a future cross current signal by analyzing the course (e.g., the previous cross current values over m cycles) of cross current values. For example, the prediction unit 2391 can output the maximum cross current signal during the last m number of cycles. However, the prediction unit 2391 can also output the current cross current signal (e.g., if the cross current only deviates on a scale larger than m cycles).

An adding unit 2394 receives the signals from the prediction unit 2391, the prediction unit 2392, and the momentary supply voltage from the momentary supply voltage register 2281 and transmits the sum of said signals to a comparing unit 2395. The comparing unit 2395 receives an estimated momentary supply voltage from an estimated momentary supply voltage register 2381 and a prediction throttle threshold from the prediction throttle threshold register 2371. The calculation for the estimated momentary supply voltage is discussed below in Table 1.

The output of logic gate 2341 transmits an alarm signal to the alarm register 2384 depending on the output of the comparing unit 2297 and the output of the comparing unit 2395. For example, the output of the logic gate 2341 can transmit an alarm signal to the alarm register 2384 when the momentary supply voltage is greater than the throttle threshold or when the estimated momentary supply voltage is greater than the prediction throttle threshold. The alarm register 2384 can be read by the subcircuit to initiate throttling of the subcircuit.

The power management unit 2200 further comprises a selected metric register 2367 for storing a selected value from the momentary supply voltage and the predictive metric. A selector 2342 can be used for the selection. The subcircuit associated with the power management unit 2200 can read the selected metric register 2367.

The registers 2283, 2282, 2281, 2384, 2273 can be updated every clock cycle. The registers 2271, 2272, 2274, and 2275 may not be updated during operation of the semiconductor circuit, but registers 2271, 2272, 2274, and 2275 can be written to only once after production of the semiconductor circuit.

It is noted that FIG. 2 is intended to depict the representative major components of an exemplary power management unit 2200. In some embodiments, however, individual components can have greater or lesser complexity than as represented in FIG. 2, components other than or in addition to those shown in FIG. 2 can be present, and the number, type, and configuration of such components can vary.

Figure 3:
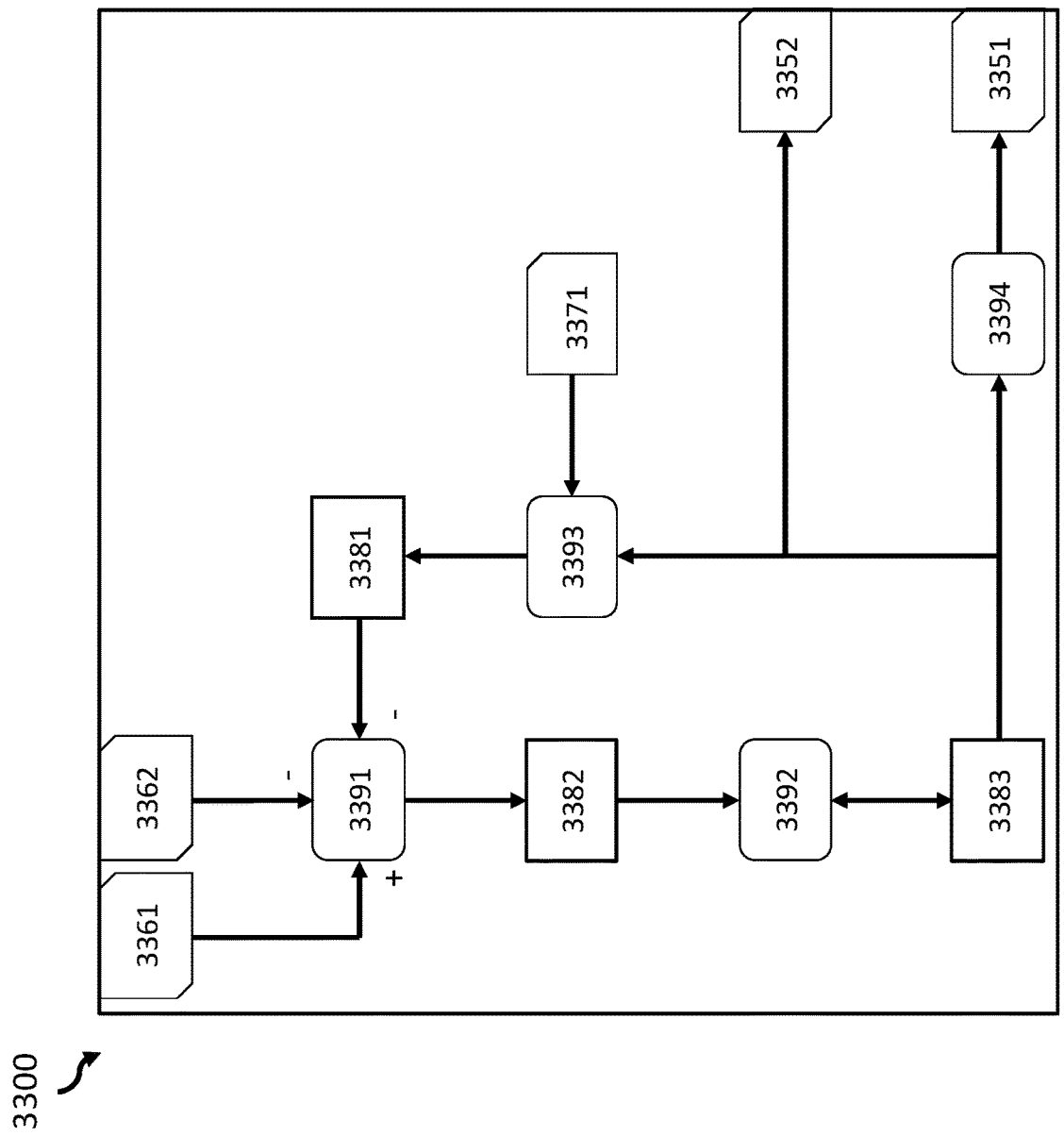
FIG. 3 is a diagram depicting a connecting unit, in accordance with embodiments of the present disclosure.

FIG. 3 illustrates a diagram of a connecting unit 3300 (e.g., connecting units 1301-1322 of FIG. 1). The connecting unit 3300 includes a first increment current signal input 3361 configured to receive a first increment current signal from a first power management unit and a second increment current signal input 3362 configured to receive a second increment current signal from a second power management unit. Further, the connecting unit 3300 includes a first current signal output 3351 configured to transmit a first current signal indicative of a cross current from the first subcircuit 1101 to the second subcircuit 1102 to the first power management unit 1201 and a second current signal output 3352 configured to transmit a second current signal to the second power management unit 1202, where the second current signal corresponds to the inverted first current signal. The connecting unit 3300 is configured to determine the first current signal based on the first increment signal and the second increment signal.

The connecting unit includes a connecting unit coefficient register 3371, an increment current sum register 3382, a cross current register 3383, a correction increment current register 3381, a summing unit 3391, an adding unit 3392, a multiplying unit 3393 and an inverting unit 3394. The summing unit 3391 receives the first increment current signal from the first increment current signal input 3361, the second increment current signal from the second increment current signal input 3362, and a correction increment current signal from the correction increment current register 3381. The summing unit 3391 transmits the first increment current signal minus the second increment current signal minus the correction increment current signal to the increment current sum register 3382. The adding unit 3392 receives an increment current sum signal from the increment current sum register 3382 and a cross current signal from the cross current register 3383 and transmits the sum of the increment current sum signal and the cross current signal to the cross current register 3383. The multiplying unit 3393 receives the cross current signal from the cross current register 3383 and a connection unit coefficient from the connection unit coefficient register 3371 and transmits the product of the cross current signal and the connection unit coefficient to the correction increment current register 3381. The inverting unit 3394 receives the cross current signal from the cross current register 3383 and transmits the negative cross current signal to the first current signal output 3351. The second current signal output 3352 receives the cross current signal from the cross current register 3383.

Table 1 depicts exemplary register values of a power management unit (e.g., power management unit 2200 of FIG. 2) in arbitrary units over 24 clock cycles.

TABLE 1

| Cycle | I_self (2282) | I_cross (2251-2256) | Q_total (2281) | th (2271) | 8*I_self_max (2392) | 8*I_cross (2391) | Q_pred (2381) | th_pred (2371) |
|---|---|---|---|---|---|---|---|---|
| 0 | 8 | 2 | 10 | 140 | | | | 140 |
| 1 | 9 | 2 | 21 | 140 | | | | 140 |
| 2 | 4 | 2 | 27 | 140 | | | | 140 |
| 3 | 10 | 2 | 39 | 140 | | | | 140 |
| 4 | 5 | 2 | 46 | 140 | | | | 140 |
| 5 | 2 | 2 | 50 | 140 | | | | 140 |
| 6 | 4 | 2 | 56 | 140 | | | | 140 |
| 7 | 6 | 2 | 64 | 140 | 80 | 16 | 160 | 140 |
| 8 | 12 | 0 | 76 | 140 | | | | 140 |
| 9 | 15 | 0 | 91 | 140 | | | | 140 |
| 10 | 9 | 0 | 100 | 140 | | | | 140 |
| 11 | 8 | 0 | 108 | 140 | | | | 140 |
| 12 | 11 | 0 | 119 | 140 | | | | 140 |
| 13 | 7 | 0 | 126 | 140 | | | | 140 |
| 14 | 14 | 0 | 140 | 140 | | | | 140 |
| 15 | 14 | 0 | 154 | 140 | 120 | 0 | 274 | 140 |
| 16 | 10 | −1 | 163 | 140 | | | | 140 |
| 17 | 5 | −1 | 167 | 140 | | | | 140 |
| 18 | 12 | −1 | 178 | 140 | | | | 140 |
| 19 | 11 | −1 | 188 | 140 | | | | 140 |
| 20 | 9 | −1 | 196 | 140 | | | | 140 |
| 21 | 3 | −1 | 198 | 140 | | | | 140 |
| 22 | 2 | −1 | 199 | 140 | | | | 140 |
| 23 | 4 | −1 | 202 | 140 | 96 | −8 | 290 | 140 |

As shown in Table 1, the first column includes the clock cycle count, the second column includes power supply current values (e.g., stored by self-current register 2282), the third column includes cross current values (e.g., stored by current signal inputs 2251-2256), the fourth column includes the momentary supply voltage (e.g., stored by the momentary supply voltage register 2281), the fifth column includes voltage throttle values (e.g., stored by the throttle threshold register 2271), the sixth column includes self-current prediction values (e.g., stored by the prediction unit 2392), the seventh column includes cross current predictions values (e.g., stored by the prediction unit 2391), the eighth column includes estimated momentary supply voltage values (e.g., stored by the estimated momentary supply voltage register 2381), and the ninth column includes predicted voltage throttle values (e.g., stored by the prediction throttle threshold register 2371).

The predicted metrics (e.g., the predicted self-current values, predicted cross current values, and predicted momentary supply voltage values) can be determined every eight cycles. At cycle 7, the max self-current (e.g., I_self) within the last eight cycles window had a value of 10 (underlined). This value is multiplied with eight to estimate the maximal augmentation of the metric during the eight cycle window. Furthermore, the present cross current (e.g., I_cross) with a value of 2 (e.g., the sum of the present cross currents to the neighboring subcircuit) is multiplied with eight. At cycle time 7, the momentary supply voltage (e.g., Q_total) has the value 64 (underlined). Hence, the predictive metric (e.g., Q_pred) is calculated to have the value 10*8+2*8+64=160. This value surpasses the predictive threshold (e.g., th_pred) which has been set to 140. The predictive threshold th_pred has been set to the same value as the threshold for the momentary supply voltage. Thus, throttling of the subcircuit can be initiated.

The momentary supply voltage only exceeds the threshold for the momentary supply voltage at cycle time 15. Hence, using the predictive metric can allow for a precautionary early throttling to avoid voltage droops.

It is noted that FIG. 3 is intended to depict the representative major components of an exemplary connecting unit 3300. In some embodiments, however, individual components can have greater or lesser complexity than as represented in FIG. 3, components other than or in addition to those shown in FIG. 3 can be present, and the number, type, and configuration of such components can vary.

Figure 4:
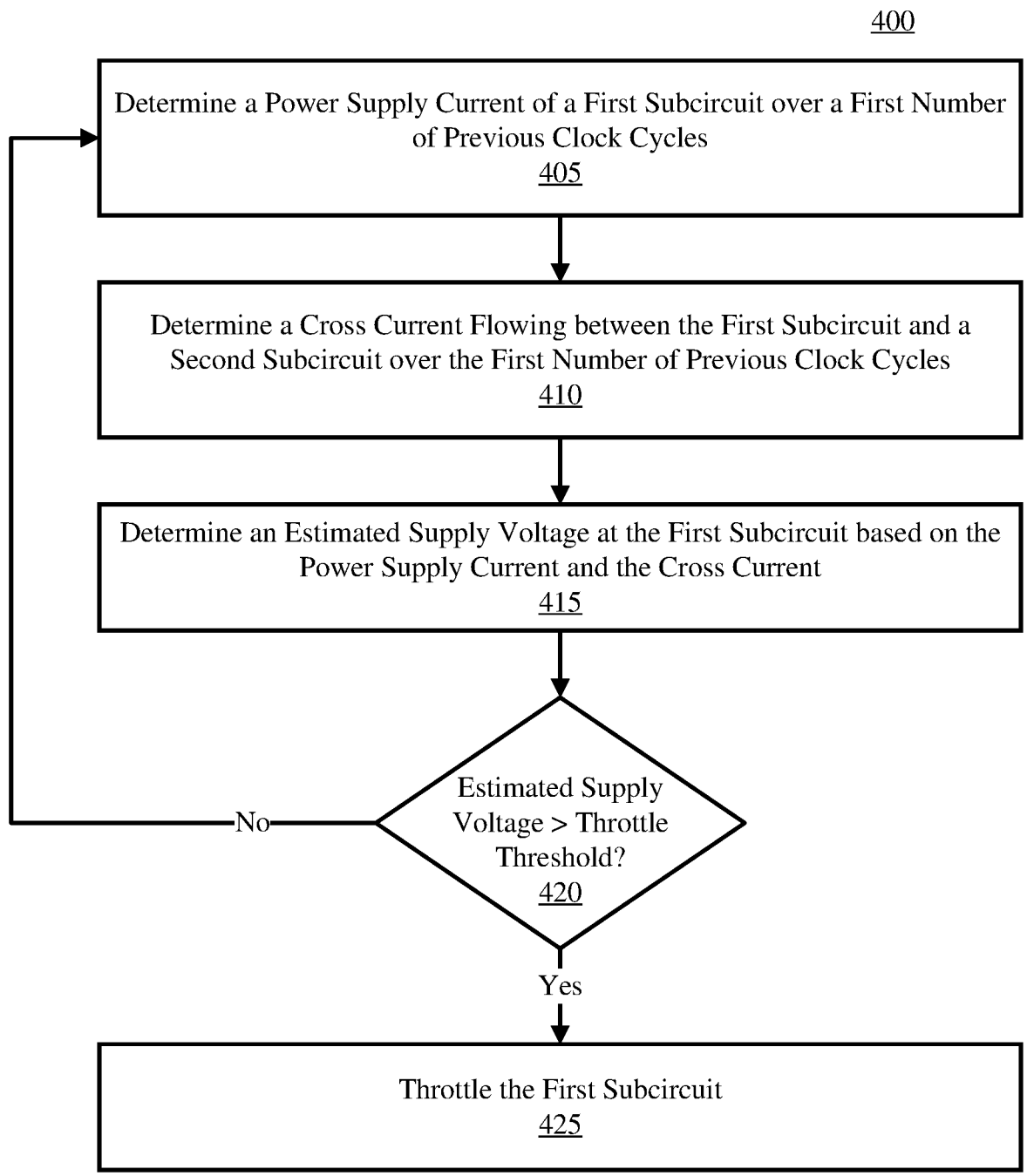
FIG. 4 is a flow-diagram depicting a method for throttling a subcircuit based on an estimated supply voltage, in accordance with embodiments of the present disclosure.

Referring now to FIG. 4, shown is a flow-diagram illustrating an example method 400 for throttling a subcircuit (e.g., subcircuit 1101 of FIG. 1) based on an estimated supply voltage (e.g., Q_pred of Table 1), in accordance with embodiments of the present disclosure.

Method 400 initiates at operation 405, where a power supply current (e.g., I_self of Table 1) of a first subcircuit is determined over a first number of previous clock cycles. The power supply current can be received by a self-current register (e.g., stored by self-current register 2282). The first number of previous clock cycles can be any suitable value (e.g., 1, 2, 4, 8, 16, 24, etc.).

A cross current flowing (e.g., I_cross of Table 1) between the first subcircuit and a second subcircuit is determined over the first number of previous clock cycles. This is illustrated at operation 410. The cross current can be received by current signal inputs (e.g., current signal inputs 2251-2256).

An estimated supply voltage (e.g., Q_pred of Table 1) at the first subcircuit is then determined based on the power supply current at the first subcircuit over the first number of previous clock cycles and the cross current flowing between the first subcircuit and a second subcircuit over the first number of previous clock cycles. This is illustrated at operation 415. In some embodiments, the estimated supply voltage can be determined by adding the momentary supply voltage (e.g., stored by the momentary supply voltage register 2281), the maximum value of the power supply current of the first subcircuit over the last m cycles multiplied by m, and the maximum value of the cross current between the first subcircuit and the second subcircuit over the last m cycles multiplied by m. For example, as depicted in Table 1, the estimated supply voltage is 64 (Q_total)+80 (8*I_self_max)+16 (8*I_cross_max)=160 (Q_pred). In this example, the previous number of cycles is 8. Thus, the maximum value of the power supply current and the maximum value of the cross current over the previous 8 cycles are multiplied by 8. In some embodiments, however, the average value of the power supply current of the first subcircuit over the last m cycles and the average value of the cross current between the first subcircuit and the second subcircuit over the last m cycles can be considered to calculate the estimated supply voltage.

A determination is made whether the estimated supply voltage is greater than a throttle threshold. This is illustrated at operation 420. As depicted in Table 1, the estimated supply voltage of 160 is compared to the throttle threshold of 140. In this example, the estimated supply voltage exceeds the throttle threshold. If a determination is made that the estimated supply voltage does not exceed the throttle threshold, then operation 420 returns to operation 405, where a power supply current of the first subcircuit over the first number of previous cycles is determined. If a determination is made that the estimated supply voltage exceeds the throttle threshold, then the first subcircuit is throttled. This is illustrated at operation 425. Following Table 1, because the estimated supply voltage exceeds the throttle threshold, the first subcircuit is throttled. This allows for predictive throttling based on the history (e.g., a course of) power supply current values and cross current values.

The aforementioned operations can be completed in any order and are not limited to those described. Additionally, some, all, or none of the aforementioned operations can be completed, while still remaining within the spirit and scope of the present disclosure.

The invention claimed is:

1. A semiconductor circuit comprising:
   a first subcircuit;
   a second subcircuit; and
   a power management circuitry, wherein the power management circuitry is configured to determine an estimated momentary supply voltage present at the first subcircuit based on a power supply current of the first subcircuit over a first number of previous clock cycles and a cross current flowing between the first subcircuit and the second subcircuit over the first number of previous clock cycles.

2. The semiconductor circuit of claim 1, wherein a maximum value of the power supply current over the first number of previous clock cycles and a maximum value of cross current over the first number of previous clock cycles are considered to determine the estimated momentary supply voltage.

3. The semiconductor circuit of claim 2, wherein the first number of previous clock cycles is eight.

4. The semiconductor circuit of claim 1, wherein an average value of the power supply current over the first number of previous clock cycles and an average value of the cross current over the first number of previous clock cycles are considered to determine the estimated momentary supply voltage.

5. The semiconductor circuit of claim 1, wherein the power management circuitry is further configured to estimate a momentary supply voltage present at the first subcircuit based on a momentary power supply current of the first subcircuit and a momentary cross current flowing between the first subcircuit and the second subcircuit.

6. The semiconductor circuit of claim 5, wherein the power management circuitry is further configured to generate a throttle signal for throttling the first subcircuit based on a comparison of the momentary supply voltage with a throttle threshold.

7. The semiconductor circuit of claim 1, wherein the power management circuitry is further configured to generate a throttle signal for throttling the first subcircuit based on a comparison of the estimated momentary supply voltage with a prediction throttle threshold.

8. The semiconductor circuit of claim 1, wherein the power management circuitry includes a grid of power management units, wherein each of the power management units corresponds to a subcircuit, wherein each power management unit is configured to determine an estimated momentary supply voltage and momentary supply voltage related to its corresponding subcircuit, and wherein each power management unit is configured to throttle its corresponding subcircuit based on the estimated momentary supply voltage and momentary supply voltage.

9. A method for predicting undervoltage conditions at a semiconductor circuit, the semiconductor circuit including a first subcircuit and a second subcircuit, the method comprising:
  determining a power supply current of the first subcircuit over a first number of previous clock cycles;
  determining a cross current flowing between the first subcircuit and the second subcircuit over the first number of previous clock cycles; and
  determining an estimated momentary supply voltage present at the first subcircuit based on the power supply current of the first subcircuit over the first number of previous clock cycles and the cross current flowing between the first subcircuit and the second subcircuit over the first number of previous clock cycles.

10. The method of claim 9, wherein a maximum value of the power supply current over the first number of previous clock cycles and a maximum value of the cross current over the first number of previous clock cycles are considered to determine the estimated momentary supply voltage.

11. The method of claim 10, wherein the first number of previous clock cycles is eight.

12. The method of claim 9, wherein an average value of the power supply current over the first number of previous clock cycles and an average value of the cross current over the first number of previous clock cycles are considered to determine the estimated momentary supply voltage.

13. The method of claim 9, further comprising:
  estimating a momentary supply voltage present at the first subcircuit based on a momentary power supply current of the first subcircuit and a momentary cross current flowing between the first subcircuit and the second subcircuit.

14. The method of claim 9, further comprising:
  throttling the first subcircuit based on a comparison of a momentary power supply current to a throttle threshold.

15. The method of claim 9, further comprising:
  throttling the first subcircuit based on a comparison of the estimated momentary supply voltage with a prediction threshold.

* * * * *